United States Patent
Zeng et al.

(10) Patent No.: US 10,650,743 B2
(45) Date of Patent: May 12, 2020

(54) METHOD FOR DRIVING PIXEL CIRCUIT

(71) Applicant: Shenzhen China Star Optoelectronics Technology Co., Ltd., Shenzhen, Guangdong (CN)

(72) Inventors: Yuchao Zeng, Guangdong (CN); Pengfei Liang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 360 days.

(21) Appl. No.: 15/565,461

(22) PCT Filed: Aug. 11, 2017

(86) PCT No.: PCT/CN2017/097038
§ 371 (c)(1),
(2) Date: Oct. 10, 2017

(87) PCT Pub. No.: WO2019/006820
PCT Pub. Date: Jan. 10, 2019

(65) Prior Publication Data
US 2019/0385514 A1    Dec. 19, 2019

(30) Foreign Application Priority Data
Jul. 6, 2017 (CN) .......................... 2017 1 0545849

(51) Int. Cl.
*G09G 3/325* (2016.01)
*G09G 3/3258* (2016.01)
(Continued)

(52) U.S. Cl.
CPC ........... *G09G 3/325* (2013.01); *G09G 3/3225* (2013.01); *G09G 3/3258* (2013.01);
(Continued)

(58) Field of Classification Search
CPC .... G09G 3/325; G09G 3/3258; G09G 3/3241; G09G 3/3233; G09G 3/3225;
(Continued)

(56) References Cited

U.S. PATENT DOCUMENTS

2015/0029171 A1 * 1/2015 Jo ........................ G09G 3/3258
345/212

FOREIGN PATENT DOCUMENTS

CN         105374320 A * 3/2016 ........... G09G 3/3233
CN         105427794 A * 3/2016 ........... G09G 3/3233
(Continued)

OTHER PUBLICATIONS

International Search Report for PCT/CN2017/097038, dated Apr. 12, 2018, with English translation. (Year: 2018).*

*Primary Examiner* — Julie Anne Watko

(57) ABSTRACT

Disclosed is a method for driving a pixel circuit. The method includes steps of obtaining an actual threshold voltage and an actual current-to-voltage conversion factor of a driving thin film transistor as well as actual luminous efficiency of an organic light emitting diode in sequence; and calculating a compensation data signal inputted to a source of a switching thin film transistor based on the obtained actual threshold voltage and actual current-to-voltage conversion factor of the driving thin film transistor and the obtained actual luminous efficiency of the organic light emitting diode.

20 Claims, 3 Drawing Sheets

---

S110

Obtaining an actual threshold voltage and an actual current-to-voltage conversion factor of a driving thin film transistor, and actual luminous efficiency of an organic light emitting diode in sequence

S120

Calculating a compensation data signal inputted to a source of the switching thin film transistor based on the obtained actual threshold voltage and actual current-to-voltage conversion factor of the driving thin film transistor and the obtained actual luminous efficiency of the organic light emitting diode

(51) Int. Cl.
    *H01L 27/32*      (2006.01)
    *G09G 3/3225*    (2016.01)

(52) U.S. Cl.
    CPC ...... *H01L 27/3262* (2013.01); *H01L 27/3265* (2013.01); *G09G 2320/043* (2013.01)

(58) Field of Classification Search
    CPC .......... G09G 3/3208; G09G 3/32; G09G 3/30; G09G 3/22; G09G 3/2092; G09G 3/20; G09G 3/00; G09G 2320/043; G09G 2320/04; G09G 2320/00; H01L 27/3262; H01L 27/3265; H01L 27/326; H01L 27/3244; H01L 27/3241; H01L 27/32; H01L 27/24; H01L 27/00
    See application file for complete search history.

(56) References Cited

FOREIGN PATENT DOCUMENTS

| | | | | |
|---|---|---|---|---|
| CN | 105741760 A | * | 7/2016 | ........... G09G 3/3258 |
| CN | 106097943 A | * | 11/2016 | |
| CN | 106531078 A | * | 3/2017 | |

* cited by examiner

METHOD FOR DRIVING PIXEL CIRCUIT

CROSS-REFERENCE TO RELATED APPLICATIONS

This application claims the priority of Chinese patent application CN 201710545849.0, entitled "Method for driving pixel circuit" and filed on Jul. 6, 2017, the entirety of which is incorporated herein by reference.

FIELD OF THE INVENTION

The present disclosure relates to the technical field of display control, and in particular, to a method for driving an AMOLED pixel circuit.

BACKGROUND OF THE INVENTION

FIG. 1 schematically shows a structure of an AMOLED (Active Matrix Organic Light Emitting Diode) pixel circuit in the prior art. The pixel circuit comprises a switching thin film transistor T11, a driving thin film transistor T12, a controlling thin film transistor T13, a storage capacitor C14, and an organic light emitting diode OLED15. A gate of the switching thin film transistor T11 is configured to input a scanning signal, a source thereof is configured to input a data signal, and a drain thereof is connected to a gate of the driving thin film transistor T12. A source of the driving thin film transistor T12 is configured to input a first driving voltage OVDD, and a drain thereof is connected to a drain of the controlling thin film transistor T13 and an anode of the organic light emitting diode OLED15. A gate of the controlling thin film transistor T13 is configured to input a control signal SEN, and a source thereof is configured to input an enable signal VCM_en. A first end of the storage capacitor C14 is connected to the gate of the driving thin film transistor T12, and a second end thereof is connected to the drain of the driving thin film transistor T12. A cathode of the organic light emitting diode OLED15 is connected to a second driving voltage OVSS.

As to the pixel circuit as shown in FIG. 1, brightness uniformity of a display panel can be improved by compensating differences in threshold voltage Vth between the gate of the driving thin film transistor T12 and the drain thereof, as well as in current-to-voltage conversion factor k of the driving thin film transistor T12 in each of the pixel circuits. However, differences in luminous efficiency η of the organic light emitting diode OLED15 can also cause non-uniform brightness of the display panel. In an existing pixel circuit, differences in k and in Vth can be compensated, but differences in luminous efficiency η of the organic light emitting diode OLED15 cannot be compensated.

SUMMARY OF THE INVENTION

In order to solve the above problem, the present disclosure provides a method for driving a pixel circuit, so as to compensate luminous efficiency of an organic light emitting diode and improve brightness uniformity of a display panel.

According to an embodiment of the present disclosure, a method for driving a pixel circuit is provided. The pixel circuit comprises a switching thin film transistor, a driving thin film transistor, a controlling thin film transistor, a storage capacitor, and an organic light emitting diode. A gate of the switching thin film transistor is configured to input a scanning signal, a source thereof is configured to input a data signal, and a drain thereof is connected to a gate of the driving thin film transistor. A source of the driving thin film transistor is configured to input a first driving voltage, and a drain thereof is connected to a drain of the controlling thin film transistor and an anode of the organic light emitting diode. A gate of the controlling thin film transistor is configured to input a control signal, and a source thereof is configured to input an enable signal. A first end of the storage capacitor is connected to the gate of the driving thin film transistor, and a second end thereof is connected to the drain of the driving thin film transistor. A cathode of the organic light emitting diode is connected to a second driving voltage.

The method comprises steps as follows.

A scanning signal, a data signal, a control signal, an enable signal, a first driving voltage, and a second driving voltage are applied to the pixel circuit. An actual threshold voltage and an actual current-to-voltage conversion factor of the driving thin film transistor and actual luminous efficiency of the organic light emitting diode are obtained in sequence.

A compensation data signal inputted to the source of the switching thin film transistor is calculated, based on the obtained actual threshold voltage and actual current-to-voltage conversion factor of the driving thin film transistor and actual luminous efficiency of the organic light emitting diode, so as to compensate a threshold voltage and a current-to-voltage conversion factor of the driving thin film transistor, and luminous efficiency of the organic light emitting diode.

According to an embodiment of the present disclosure, the step of obtaining the actual threshold voltage of the driving thin film transistor comprises sub steps as follows.

A scanning signal is applied to the gate of the switching thin film transistor, and a first data signal is applied to the source thereof respectively, so that the gate of the driving thin film transistor reaches a first preset initial potential. At the same time, a control signal is applied to the gate of the controlling thin film transistor, and an enable signal is applied to the source thereof respectively, so that the drain of the driving thin film transistor reaches a preset initial potential.

Application of the enable signal to the source of the controlling thin film transistor is stopped. The drain of the driving thin film transistor is charged by the first driving voltage until the pixel circuit is in a stable state, and then an electric potential value at the drain of the driving thin film transistor is collected.

The actual threshold voltage of the driving thin film transistor is calculated according to an electric potential value at the gate of the driving thin film transistor and an electric potential value at the drain thereof.

According to an embodiment of the present disclosure, the first preset initial potential, the threshold voltage of the driving thin film transistor, and the preset initial potential satisfy a following condition:

$$Vth_{OLED} > Vdata - VCM > Vth$$

wherein, $Vth_{OLED}$ represents a threshold voltage of the organic light emitting diode; Vdata represents the first preset initial potential; VCM represents the preset initial potential; and Vth represents the threshold voltage of the driving thin film transistor.

According to an embodiment of the present disclosure, the step of calculating the actual threshold voltage of the driving thin film transistor further comprises obtaining the actual threshold voltage by calculating a difference between the electric potential value at the gate of the driving thin film transistor and the electric potential value at the drain thereof.

According to an embodiment of the present disclosure, the step of obtaining the actual current-to-voltage conversion factor of the driving thin film transistor comprises sub steps as follows.

A scanning signal is applied to the gate of the switching thin film transistor, and a second data signal is applied to the source thereof respectively, so that the gate of the driving thin film transistor reaches a second preset initial potential. At the same time, a control signal is applied to the gate of the controlling thin film transistor, and an enable signal is applied to the source thereof respectively, so that the drain of the driving thin film transistor reaches a preset initial potential. The second preset initial potential equals to a sum of the first preset initial potential and the actual threshold voltage of the driving thin film transistor.

Application of the scanning signal to the gate of the switching thin film transistor and application of the enable signal to the source of the controlling thin film transistor is stopped, and the drain of the driving thin film transistor is charged by the first driving voltage.

An electric potential value at the drain of the driving thin film transistor is collected, after the drain of the driving thin film transistor is charged for a predetermined time period.

The actual current-to-voltage conversion factor of the driving thin film transistor is calculated, according to a preset target current-to-voltage conversion factor of the driving transistor and a corresponding electric potential at the drain thereof, as well as the obtained electric potential value at the drain of the driving thin film transistor and the preset initial potential.

According to an embodiment of the present disclosure, the actual current-to-voltage conversion factor of the driving thin film transistor is calculated according to a following formula:

$$k0/k=(Vs01-VCM)/(Vs-VCM)$$

wherein, k0 represents the preset target current-to-voltage conversion factor of the driving thin film transistor; k represents the actual current-to-voltage conversion factor of the driving thin film transistor; Vs represents an electric potential at the drain of the driving thin film transistor corresponding to the actual current-to-voltage conversion factor thereof; and Vs01 represents an electric potential at the drain of the driving thin film transistor corresponding to the preset target current-to-voltage conversion factor thereof.

According to an embodiment of the present disclosure, the step of obtaining the actual luminous efficiency of the organic light emitting diode comprises sub steps as follows.

A scanning signal is applied to the gate of the switching thin film transistor, and a third data signal is applied to the source thereof respectively, so that the gate of the driving thin film transistor reaches a third preset initial potential. At the same time, a control signal is applied to the gate of the controlling thin film transistor, and an enable signal is applied to the source thereof respectively, so that the drain of the driving thin film transistor reaches a preset initial potential. The third preset initial potential is calculated based on the first preset initial potential, the actual threshold voltage, the preset target threshold voltage, and the preset initial potential of the driving thin film transistor.

Application of the scanning signal to the gate of the switching thin film transistor and application of the enable signal to the source of the controlling thin film transistor is stopped. The first driving voltage enables a current flowing through the organic light emitting diode via the driving thin film transistor to be constant.

The organic light emitting diode is charged until a voltage difference between two ends thereof is stabilized, and then an electric potential value at the drain of the driving thin film transistor is collected.

The actual luminous efficiency of the organic light emitting diode is calculated according to preset target luminous efficiency of the organic light emitting diode and a corresponding electric potential value at the drain of the driving thin film transistor as well as the second driving voltage, and based on an inverse proportional relationship between the luminous efficiency of the organic light emitting diode and the voltage difference between the two ends thereof.

According to an embodiment of the present disclosure, the third preset initial potential is calculated according to a following formula:

$$V_g'' = \sqrt{\frac{k0}{k}} (Vdata - VCM) + VCM + \Delta V_{th}$$

Wherein, $V_g''$ represents the third preset initial potential, and $\Delta V_{th}$ represents a difference between the preset target threshold voltage and the actual threshold voltage of the driving thin film transistor.

According to an embodiment of the present disclosure, the actual luminous efficiency of the organic light emitting diode is calculated according to a following formula:

$$\eta 0 = \eta(Vs-OVSS)/(Vs02-OVSS)$$

wherein, $\eta 0$ represents the preset target luminous efficiency of the organic light emitting diode; $\eta$ represents the actual luminous efficiency of the organic light emitting diode; Vs02 represents an electric potential at the drain of the driving thin film transistor corresponding to the preset target luminous efficiency of the organic light emitting diode; OVSS represents the second driving voltage; and Vs represents an electric potential at the drain of the driving thin film transistor corresponding to the actual luminous efficiency of the organic light emitting diode.

According to an embodiment of the present disclosure, the step of calculating a compensation data signal inputted to the source of the switching thin film transistor, based on the obtained actual threshold voltage and actual current-to-voltage conversion factor of the driving thin film transistor and actual luminous efficiency of the organic light emitting diode comprises sub steps as follows.

The actual current-to-voltage conversion factor of the driving thin film transistor and the actual luminous efficiency of the organic light emitting diode are compensated according to a following formula:

$$V_g' = \sqrt{\frac{k0 * \eta 0}{k * \eta}} (Vg - Vs) + Vs$$

wherein, $V_g'$ represents an electric potential of the gate of the driving thin film transistor after the actual current-to-voltage conversion factor of the driving thin film transistor and the actual luminous efficiency of the organic light emitting diode are compensated.

The actual threshold voltage of the driving thin film transistor is compensated according to a following formula:

$$V_g''=V_g'+\Delta V_{th}$$

wherein, $V_g'$ represents an electric potential of the gate of the driving thin film transistor after the actual threshold voltage thereof is compensated, and $\Delta V_{th}$ represents a difference between the preset target threshold voltage of the driving thin film transistor and the actual threshold voltage thereof.

A compensation data signal inputted to the source of the switching thin film transistor is determined, according to the electric potential of the gate of the driving thin film transistor after the actual threshold voltage thereof is compensated.

The present disclosure has following beneficial effects.

In the present disclosure, the actual threshold voltage and the actual current-to-voltage conversion factor of the driving thin film transistor, and the actual luminous efficiency of the organic light emitting diode are obtained and compensated in a predetermined order, whereby brightness uniformity of a display panel can be improved.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments can be combined together in any manner, and the technical solutions obtained in this manner all fall within the scope of the present disclosure.

Figure 1:
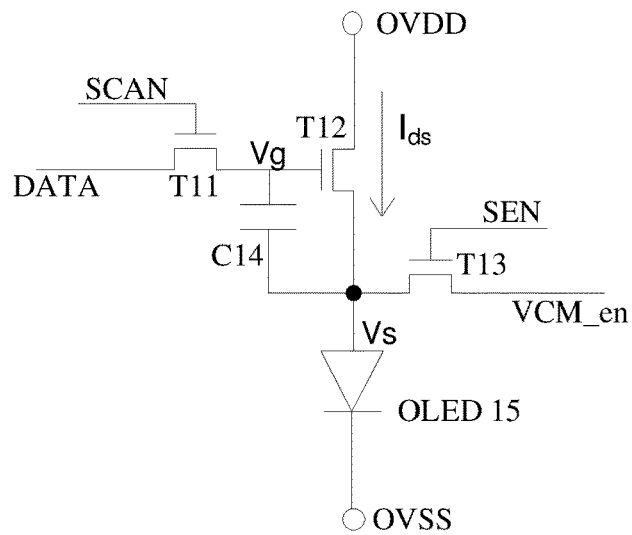
FIG. 1 schematically shows a structure of an AMOLED pixel circuit in the prior art.

In an AMOLED pixel circuit as shown in FIG. 1, luminance L of an organic light emitting diode OLED15 is proportional to a current $I_{OLED}$ thereof:

$$L=\eta * I_{OLED} \qquad (1)$$

wherein, $\eta$ represents luminous efficiency of the organic light emitting diode OLED15.

A driving thin film transistor T12 operates in a saturated state, and a current Ids between a source and a drain of the driving thin film transistor T12 is controlled by a voltage at a gate thereof:

$$I_{ds}=k(Vg-Vg-Vth)^2 \qquad (2)$$

wherein k represents an actual current-to-voltage conversion factor of the driving thin film transistor T12; Vg represents an electric potential at the gate of the driving thin film transistor T12; Vs represents an electric potential at a drain of the driving thin film transistor T12; and Vth represents an actual threshold voltage of the driving thin film transistor T12.

The organic light emitting diode OLED15 and the driving thin film transistor T12 are connected to each other in series, and therefore:

$$Ids=I_{OLED} \qquad (3)$$

For each pixel in a display panel, due to differences in $V_{th}$ and in k of the driving thin film transistor T12 and in the luminous efficiency $\eta$ of the organic light emitting diode OLED15, there are differences in current Ids among pixels under a condition that $V_{th}$ and k of one pixel are respectively the same as those of any other pixel.

Figure 2A:
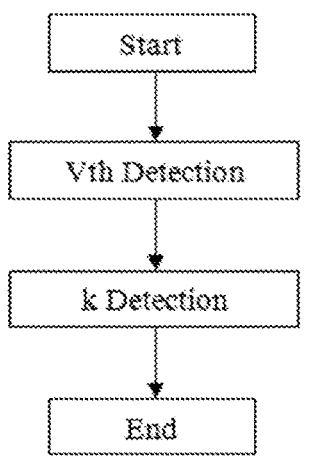
FIG. 2a is a flow chart showing an order for detecting a threshold voltage and a current-to-voltage conversion factor of a driving thin film transistor in the structure of the pixel circuit as shown in FIG. 1 in the prior art.
Figure 2B:
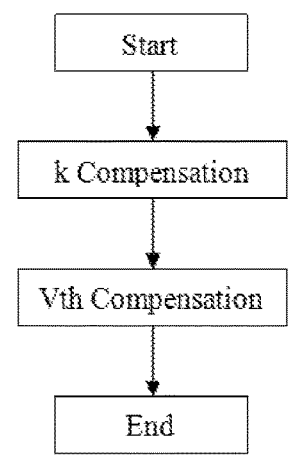
FIG. 2b is a flow chart showing an order for compensating the threshold voltage and the current-to-voltage conversion factor of the driving thin film transistor in the structure of the pixel circuit as shown in FIG. 1 in the prior art.

In the prior art, a threshold voltage and a current-to-voltage conversion factor of a driving thin film transistor are obtained in an order as shown in FIG. 2a, and the threshold voltage and the current-to-voltage conversion factor of the driving thin film transistor are compensated in an order as shown in FIG. 2b. A voltage at a gate of the driving thin film transistor is compensated based on the threshold voltage and the current-to-voltage conversion factor thereof:

$$V_g'' = \sqrt{\frac{k0}{k}}\,(Vg-Vs)+Vs+\Delta V_{th} \qquad (4)$$

wherein, k represents an actual current-to-voltage conversion factor of a driving thin film transistor of a current pixel; k0 represents a preset target current-to-voltage conversion factor; $\Delta V_{th}$ represents a difference between an actual threshold voltage and a target threshold voltage of the current pixel.

An electric potential at a gate of a driving thin film transistor of each pixel is driven by $V_g''$ instead of Vg, and thus differences in k and in Vth of a driving thin film transistor among different pixels can be compensated. However, differences in the luminous efficiency $\eta$ of an organic light emitting diode OLED15 among different pixels cannot be compensated.

Figure 3:
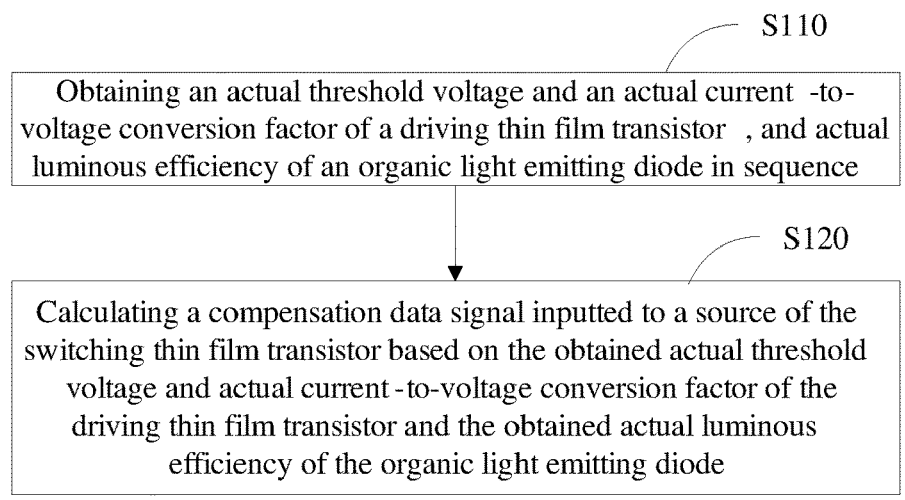
FIG. 3 is a flow chart of a method for driving a pixel circuit according to an embodiment of the present disclosure.

Therefore, the present disclosure provides a method for driving an AMOLED pixel circuit. FIG. 3 is a flow chart of a method according to an embodiment of the present disclosure. The present disclosure will be explained in detail hereafter with reference to FIG. 3.

Figure 4:
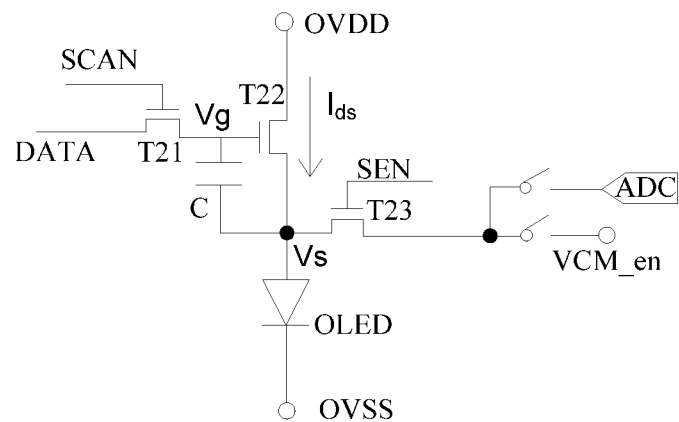
FIG. 4 schematically shows a structure of an AMOLED pixel circuit according to an embodiment of the present disclosure.

The method is used for driving an AMOLED pixel circuit as shown in FIG. 4. The pixel circuit comprises a switching thin film transistor T21, a driving thin film transistor T22, a controlling thin film transistor T23, a storage capacitor C, and an organic light emitting diode OLED. A gate of the switching thin film transistor T21 is configured to input a scanning signal SCAN, a source thereof is configured to input a data signal DATA, and a drain thereof is connected to a gate of the driving thin film transistor T22. A source of the driving thin film transistor T22 is configured to input a first driving voltage OVDD, and a drain thereof is connected to a drain of the controlling thin film transistor T23 and an anode of the organic light emitting diode OLED. A cathode of the organic light emitting diode OLED is connected to a second driving voltage OVSS. A gate of the controlling thin film transistor T23 is configured to input a control signal SEN, and a source thereof is configured to input an enable signal VCM. A first end of the storage capacitor C is connected to the gate of the driving thin film transistor T22, and a second end thereof is connected to the drain of the driving thin film transistor T22. Moreover, in order to facilitate data acquisition, a data acquisition circuit ADC is further provided at the drain of the controlling thin film transistor T23.

The method comprises two steps as follows. In step S110, a scanning signal, a data signal, a control signal, an enable signal, a first driving voltage, and a second driving voltage are applied to a pixel circuit, and an actual threshold voltage and an actual current-to-voltage conversion factor of a driving thin film transistor, and actual luminous efficiency of an organic light emitting diode are obtained in sequence. In step S120, a compensation data signal inputted to the source of the switching thin film transistor is calculated based on the obtained actual threshold voltage and actual current-to-voltage conversion factor of the driving thin film transistor and the obtained actual luminous efficiency of the organic light emitting diode, so as to compensate a threshold voltage and a current-to-voltage conversion factor of the driving thin film transistor and luminous efficiency of the organic light emitting diode.

Figure 5A:
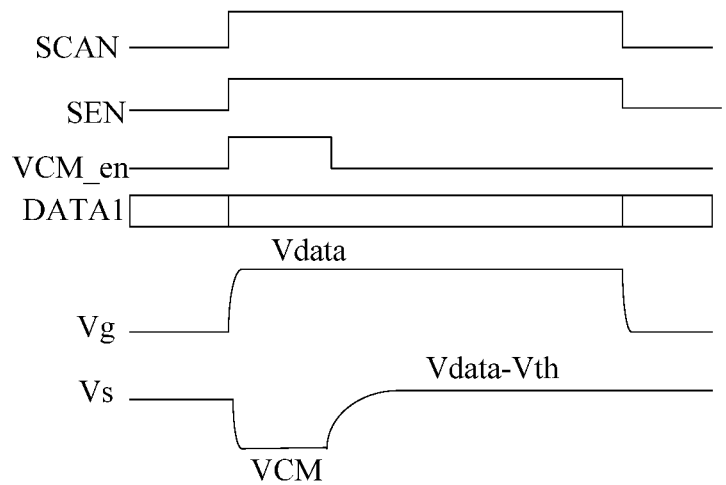
FIG. 5a schematically shows waveforms of signals when a threshold voltage of a driving thin film transistor is detected according to an embodiment of the present disclosure.

In step S110, a threshold voltage Vth of the driving thin film transistor T22 is obtained first. Specifically, with reference to FIG. 5a, a scanning signal SCAN is applied to the gate of the switching thin film transistor T21, and a first data signal DATA1 is applied to the source thereof respectively, so that the gate of the driving thin film transistor T22 reaches a first preset initial potential Vdata. At the same time, a control signal SEN is applied to the gate of the controlling thin film transistor T23, and an enable signal VCM_en is applied to the source thereof respectively, so that the drain of the driving thin film transistor T22 reaches a preset initial potential VCM.

Then, application of the enable signal VCM_en to the source of the controlling thin film transistor T23 is stopped, and the drain of the driving thin film transistor is charged by the first driving voltage OVDD. After the pixel circuit reaches a stable state, an electric potential value Vs at the drain of the driving thin film transistor T22 is collected. After the pixel circuit is in a stable state, the drain of the driving thin film transistor T22 is charged to Vdata−Vth. The electric potential value at the drain of the driving thin film transistor T22 can be read by the data acquisition circuit ADC.

Finally, an actual threshold voltage Vth of the driving thin film transistor T22 is calculated according to an electric potential value at the gate of the driving thin film transistor T22 and an electric potential value at the drain thereof. The actual threshold voltage Vth is a difference between the electric potential value at the gate of the driving thin film transistor T22 and the electric potential value at the drain thereof, i.e., $$Vth=Vg-Vs \quad (5)$$

It can be seen from Formula (5) that, in order to ensure that the drain of the driving thin film transistor can be charged to Vdata−Vth, the driving thin film transistor T22 should be turned on, so that the drain of the driving thin film transistor is charged by the first driving voltage. Therefore, a condition Vdata−VCM>Vth is required herein. However, it is not necessary to light up an organic light emitting diode OLED, and a condition $Vth_{OLED}$−Vdata−VCM>Vth is required herein. $Vth_{OLED}$ represents a threshold voltage of the organic light emitting diode OLED.

Figure 5B:
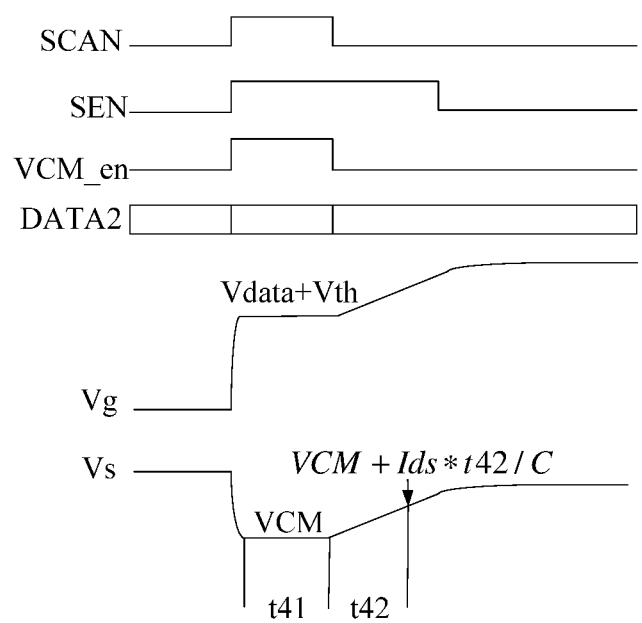
FIG. 5b schematically shows waveforms of signals when a current-to-voltage conversion factor of the driving thin film transistor is detected according to an embodiment of the present disclosure.

Next, an actual current-to-voltage conversion factor k of the driving thin film transistor T22 is obtained. Specifically, with reference to FIG. 5b, a scanning signal SCAN is applied to the gate of the switching thin film transistor T21, and a second data signal DATA2 is applied to the source thereof respectively, so that the gate of the driving thin film transistor T22 reaches a second preset initial potential Vdata+Vth. At the same time, a control signal SEN is applied to the gate of the controlling thin film transistor T23, and an enable signal VCM_en is applied to the source thereof respectively, so that the drain of the driving thin film transistor T22 reaches a preset initial potential VCM. The second preset initial potential equals to a sum of the first preset initial potential and the actual threshold voltage of the driving thin film transistor. This process corresponds to a time period t41 in FIG. 5b.

Then, application of the scanning signal to the gate of the switching thin film transistor T21 and application of the enable signal to the source of the controlling thin film transistor T23 is stopped, and the drain of the driving thin film transistor T22 is charged by the first driving voltage OVDD. After a power supply to the gate of the driving thin film transistor T22 and the source of the controlling thin film transistor T23 is cut off, a voltage difference Vgs between the gate of the driving thin film transistor T22 and the drain thereof is constant and larger than its actual threshold voltage Vth. Thus, the driving thin film transistor T22 is turned on, and the drain of the driving thin film transistor T22 is charged by a constant current Ids. At this time, an effect of the actual threshold voltage of the driving thin film transistor T22 has been eliminated by Ids. The constant current Ids is represented by a formula as follows:

$$Ids=k(Vgs-Vth)^2=k(Vdata-VCM)^2 \quad (6)$$

wherein, k represents the actual current-to-voltage conversion factor of the driving thin film transistor T22 of a current pixel.

Afterwards, after the drain of the driving thin film transistor is charged for a predetermined time period, an electric potential value at the drain of the driving thin film transistor T22 is collected. Specifically, after the drain of the driving thin film transistor T22 is charged for a predetermined time period t42 (for example, a certain time period during which the electric potential value at the drain of T22 changes after a power supply to the gate and the drain of the driving thin film transistor T22 is cut off can be selected to collect the electric potential value thereof, otherwise, there is no current flowing in the circuit after the electric potential at the drain is stabilized, and thus a flow rate of the current cannot be monitored), the drain of the driving thin film transistor T22 is sampled. At this time, the electric potential at the drain is VCM+Ids*t42/C, wherein c represents capacitance of the capacitor C. Moreover, VCM+Ids*t41/C<Vth$_{OLED}$, and $$Ids=(Vs-VCM)*C/t41 \quad (7)$$

Finally, the actual current-to-voltage conversion factor of the driving thin film transistor T22 is calculated according to a preset target current-to-voltage conversion factor of the driving thin film transistor T22 and a corresponding electric potential at the drain thereof, as well as the obtained electric potential at the drain potential of the driving thin film transistor T22 and the preset initial potential. Specifically, a preset target current-to-voltage conversion factor of the driving thin film transistor T22 and a corresponding electric potential at the drain thereof are selected. The actual current-to-voltage conversion factor of the driving thin film transistor T22 is calculated according to the electric potential at the drain of the driving thin film transistor T22 and the enable signal (based on which the preset initial potential can be obtained). In particular, a preset target current-to-voltage conversion factor k0 of the driving thin film transistor is selected, and the electric potential Vs01 at the drain of the driving thin film transistor corresponding to k0 is known (k0 can be obtained by calculating an average value of multiple current-to-voltage conversion factors of the driving thin film transistor, and Vs01 can be obtained by calculating an average value of corresponding drain potential values by a statistical method). Thus, k can be calculated according to a formula as follows:

$$k0/k=(Vs01-VCM)/(Vs-VCM) \quad (8)$$

or, it can be deduced from Formula (6) that:

$$k=Ids/(Vdata-VCM)^2 \quad (9)$$

Thus, Ids can be calculated based on Formula (7), and the current-to-voltage conversion factor k of the driving thin film transistor can be calculated based on Formula (9). Formula (8) can be deduced from Formulas (7) and (9), and thus two values, i.e., the capacitance of the capacitor C and the time period t41, are not used any more.

Next, actual luminous efficiency η of an organic light emitting diode is obtained. Specifically, a scanning signal SCAN is applied to the gate of the switching thin film transistor T21, and a third data signal DATA3 is applied to the source thereof respectively, so that the gate of the driving thin film transistor T22 reaches a third preset initial potential:

$$V_g'' = \sqrt{\frac{k0}{k}}(Vdata-VCM) + VCM + \Delta V_{th} \quad (10)$$

wherein $\Delta V_{th}$ represents a difference between the actual threshold voltage and the preset target threshold voltage of the driving thin film transistor T22 of a current pixel. The third preset initial potential is calculated based on the first preset initial potential Vdata, the threshold voltage Vth, the preset target threshold voltage, and the first preset initial potential VCM. A control signal is applied to the gate of the controlling thin film transistor, and an enable signal VCM_en is applied to the source thereof respectively, so that the drain of the driving thin film transistor reaches a preset initial potential VCM.

Then, application of the scanning signal to the gate of the switching thin film transistor T21 and application of the enable signal VCM_en to the source of the controlling thin film transistor T23 is stopped. The first driving voltage enables a current flowing through the organic light emitting diode via the driving thin film transistor to be constant. Moreover, after a power supply to the gate and the drain of the driving thin film transistor is cut off, a voltage difference Vgs therebetween is constant, and it can be ensured that the current following through the organic light emitting diode OLED is constant. In this case:

$$Ids=k(V_g''-VCM)=k0(Vdata-VCM)^2 \quad (11)$$

Figure 5C:
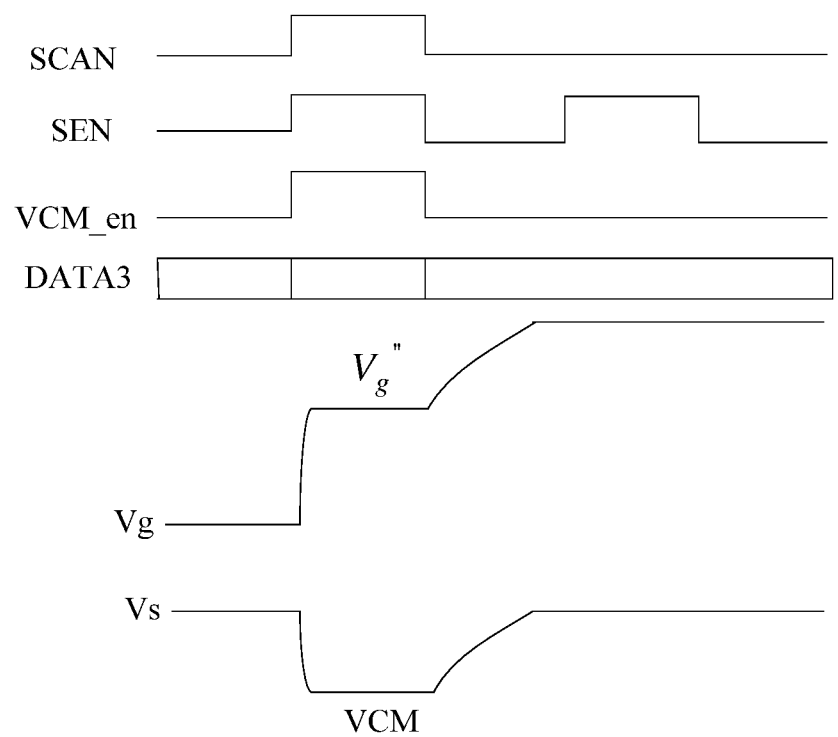
FIG. 5c schematically shows waveforms of signals when luminous efficiency of an organic light emitting diode is detected according to an embodiment of the present disclosure.

Afterwards, the organic light emitting diode is charged until a voltage difference between two ends thereof is stabilized, and then an electric potential value at the drain of the driving thin film transistor T22 is collected. As shown in FIG. 5c, after the organic light emitting diode OLED is charged for a period of time, a voltage difference between an anode and a cathode thereof is stabilized, and then a voltage at the drain of the driving thin film transistor T22 is read by a data acquisition circuit ADC. Thus, voltage differences between the two ends of the organic light emitting diode OLED driven by a same current can be obtained.

Finally, based on an inverse proportional relationship between the luminous efficiency of the organic light emitting diode and the voltage difference between the two ends thereof, the actual luminous efficiency of the organic light emitting diode OLED is calculated according to the preset target luminous efficiency of the organic light emitting diode, a corresponding electric potential value at the drain of the driving thin film transistor, and a second driving voltage OVSS. With a same current, the luminous efficiency η of the organic light emitting diode OLED is inversely proportional to the voltage difference between the two ends thereof. Target luminous efficiency η0 is selected to compensate the luminous efficiency η of the OLED of the pixel. The relationship between the actual luminous efficiency η and the target luminous efficiency η0 of the organic light emitting diode OLED is represented as follows:

$$\eta0/\eta=(Vs-OVSS)/(Vs02-OVSS) \quad (12)$$

wherein Vs02 represents a voltage Vs when the organic light emitting diode OLED has a target luminous efficiency η0 (η0 can be obtained by calculating an average value of multiple luminous efficiency values of the OLEDs, and Vs02 can be obtained by calculating an average value of corresponding drain potential values by a statistical method).

Subsequently, in step S120, when an image is displayed, η and k are compensated first. A fourth data signal is applied to the source of the switching thin film transistor T21. The fourth data signal enables the gate potential of the driving thin film transistor to be:

$$V_g' = \sqrt{\frac{k0*\eta0}{k*\eta}}(Vg-Vs) + Vs \quad (13)$$

After that, the threshold voltage of the driving thin film transistor is compensated, and the gate potential thereof is:

$$V_g''=V_g'+\Delta V_{th} \quad (14)$$

A formula for calculating luminance of the organic light emitting diode OLED after compensation is as follows:

$$L = \eta 0 * k0(Vg - Vs - Vth0)^2 \qquad (15)$$

wherein Vth0 represents a preset threshold voltage of the driving thin film transistor, and $\Delta V_{th}$ represents a difference between the preset threshold voltage and a detected actual threshold voltage of the driving thin film transistor.

It can be seen from Formula (15) that, the method provided by the present disclosure can compensate Vth and k of the driving thin film transistor as well as η of the organic light emitting diode OLED.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for driving a pixel circuit,
wherein the pixel circuit comprises a switching thin film transistor, a driving thin film transistor, a controlling thin film transistor, a storage capacitor, and an organic light emitting diode,
wherein, a gate of the switching thin film transistor is configured to input a scanning signal, a source thereof is configured to input a data signal, and a drain thereof is connected to a gate of the driving thin film transistor;
wherein, a source of the driving thin film transistor is configured to input a first driving voltage, and a drain thereof is connected to a drain of the controlling thin film transistor and an anode of the organic light emitting diode;
wherein, a gate of the controlling thin film transistor is configured to input a control signal, and a source thereof is configured to input an enable signal; and
wherein, a first end of the storage capacitor is connected to the gate of the driving thin film transistor, and a second end thereof is connected to the drain of the driving thin film transistor; and
wherein a cathode of the organic light emitting diode is connected to a second driving voltage; and
wherein the method comprises steps of:
applying a scanning signal, a data signal, a control signal, an enable signal, a first driving voltage, and a second driving voltage to the pixel circuit, and obtaining an actual threshold voltage and an actual current-to-voltage conversion factor of the driving thin film transistor, and actual luminous efficiency of the organic light emitting diode in sequence; and
calculating a compensation data signal inputted to the source of the switching thin film transistor, based on the obtained actual threshold voltage and actual current-to-voltage conversion factor of the driving thin film transistor and actual luminous efficiency of the organic light emitting diode, so as to compensate a threshold voltage and a current-to-voltage conversion factor of the driving thin film transistor, and luminous efficiency of the organic light emitting diode.

2. The method according to claim 1, wherein the step of obtaining the actual threshold voltage of the driving thin film transistor comprises sub steps of:
applying a scanning signal to the gate of the switching thin film transistor and applying a first data signal to the source thereof respectively, so that the gate of the driving thin film transistor reaches a first preset initial potential; and at the same time, applying a control signal to the gate of the controlling thin film transistor and applying an enable signal to the source thereof, so that the drain of the driving thin film transistor reaches a preset initial potential;
stopping application of the enable signal to the source of the controlling thin film transistor, and collecting an electric potential value at the drain of the driving thin film transistor after the drain of the driving thin film transistor is charged by the first driving voltage until the pixel circuit is in a stable state; and
calculating the actual threshold voltage of the driving thin film transistor according to an electric potential value at the gate of the driving thin film transistor and an electric potential value at the drain thereof.

3. The method according to claim 2, wherein the first preset initial potential, the threshold voltage of the driving thin film transistor, and the preset initial potential satisfy a following condition:

$$Vth_{OLED} > Vdata - VCM > Vth,$$

wherein, $Vth_{OLED}$ represents a threshold voltage of the organic light emitting diode; Vdata represents the first preset initial potential; VCM represents the preset initial potential; and Vth represents the threshold voltage of the driving thin film transistor.

4. The method according to claim 3, wherein the step of obtaining the actual current-to-voltage conversion factor of the driving thin film transistor comprises sub steps of:
applying a scanning signal to the gate of the switching thin film transistor and applying a second data signal to the source thereof respectively, so that the gate of the driving thin film transistor reaches a second preset initial potential; and at the same time, applying a control signal to the gate of the controlling thin film transistor and applying an enable signal to the source thereof respectively, so that the drain of the driving thin film transistor reaches a preset initial potential, wherein the second preset initial potential equals to a sum of the first preset initial potential and the actual threshold voltage of the driving thin film transistor;
stopping application of the scanning signal to the gate of the switching thin film transistor and application of the enable signal to the source of the controlling thin film transistor, and charging the drain of the driving thin film transistor by the first driving voltage;
collecting an electric potential value at the drain of the driving thin film transistor after the drain of the driving thin film transistor is charged for a predetermined time period; and
calculating the actual current-to-voltage conversion factor of the driving thin film transistor, according to a preset target current-to-voltage conversion factor of the driving thin film transistor and a corresponding electric potential value at the drain thereof, as well as the obtained electric potential value at the drain of the driving thin film transistor and the preset initial potential.

5. The method according to claim 4, wherein the actual current-to-voltage conversion factor of the driving thin film transistor is calculated according to a following formula:

$$k0/k = (Vs01 - VCM)/(Vs - VCM)$$

wherein, k0 represents the preset target current-to-voltage conversion factor of the driving thin film transistor; k represents the actual current-to-voltage conversion factor of the driving thin film transistor; Vs represents an electric potential at the drain of the driving thin film transistor corresponding to the actual current-to-voltage conversion factor thereof; and Vs01 represents an electric potential at the drain of the driving thin film transistor corresponding to the preset target current-to-voltage conversion factor thereof.

6. The method according to claim 5, wherein the step of obtaining the actual luminous efficiency of the organic light emitting diode comprises sub steps of:
applying a scanning signal to the gate of the switching thin film transistor and applying a third data signal to the source thereof respectively, so that the gate of the driving thin film transistor reaches a third preset initial potential; and at the same time, applying a control signal to the gate of the controlling thin film transistor and applying an enable signal to the source thereof respectively, so that the drain of the driving thin film transistor reaches a preset initial potential, wherein the third preset initial potential is calculated based on the first preset initial potential, the actual threshold voltage, the preset target threshold voltage, and the preset initial potential of the driving thin film transistor;
stopping application of the scanning signal to the gate of the switching thin film transistor and application of the enable signal to the source of the controlling thin film transistor, wherein the first driving voltage enables a current flowing through the organic light emitting diode via the driving thin film transistor to be constant;
charging the organic light emitting diode until a voltage difference between two ends thereof is stabilized, and then collecting an electric potential at the drain of the driving thin film transistor; and
calculating the actual luminous efficiency of the organic light emitting diode, according to preset target luminous efficiency of the organic light emitting diode and a corresponding electric potential value at the drain of the driving thin film transistor as well as the second driving voltage, and based on an inverse proportional relationship between the luminous efficiency of the organic light emitting diode and the voltage difference between the two ends thereof.

7. The method according to claim 6, wherein the third preset initial potential is calculated according to a following formula:

$$V_g'' = \sqrt{\frac{k0}{k}} (Vdata - VCM) + VCM + \Delta V_{th}$$

wherein, $V_g''$ represents the third preset initial potential, and $\Delta V_{th}$ represents a difference between the preset target threshold voltage and the actual threshold voltage of the driving thin film transistor.

8. The method according to claim 7, wherein the actual luminous efficiency of the organic light emitting diode is calculated according to a following formula:

$$\eta 0/\eta = (Vs - OVSS)/(Vs02 - OVSS)$$

wherein, $\eta 0$ represents the preset target luminous efficiency of the organic light emitting diode; $\eta$ represents the actual luminous efficiency of the organic light emitting diode; Vs02 represents an electric potential at the drain of the driving thin film transistor corresponding to the preset target luminous efficiency of the organic light emitting diode; OVSS represents the second driving voltage; and Vs represents an electric potential at the drain of the driving thin film transistor corresponding to the actual luminous efficiency of the organic light emitting diode.

9. The method according to claim 2, wherein the step of calculating the actual threshold voltage of the driving thin film transistor further comprises obtaining the actual threshold voltage by calculating a difference between the electric potential value at the gate of the driving thin film transistor and the electric potential value at the drain thereof.

10. The method according to claim 9, wherein the step of obtaining the actual current-to-voltage conversion factor of the driving thin film transistor comprises following steps of:
applying a scanning signal to the gate of the switching thin film transistor and applying a second data signal to the source thereof respectively, so that the gate of the driving thin film transistor reaches a second preset initial potential; and at the same time, applying a control signal to the gate of the controlling thin film transistor and applying an enable signal to the source thereof respectively, so that the drain of the driving thin film transistor reaches a preset initial potential, wherein the second preset initial potential equals to a sum of the first preset initial potential and the actual threshold voltage of the driving thin film transistor;
stopping application of the scanning signal to the gate of the switching thin film transistor and application of the enable signal to the source of the controlling thin film transistor, and charging the drain of the driving thin film transistor by the first driving voltage;
collecting an electric potential value at the drain of the driving thin film transistor after the drain of the driving thin film transistor is charged for a predetermined time period; and
calculating the actual current-to-voltage conversion factor of the driving thin film transistor, according to a preset target current-to-voltage conversion factor of the driving thin film transistor and a corresponding electric potential value at the drain thereof, as well as the obtained an electric potential value at the drain of the driving thin film transistor and the preset initial potential.

11. The method according to claim 10, wherein the actual current-to-voltage conversion factor of the driving thin film transistor is calculated according to a following formula:

$$k0/k = (Vs01 - VCM)/(Vs - VCM)$$

wherein, k0 represents the preset target current-to-voltage conversion factor of the driving thin film transistor; k represents the actual current-to-voltage conversion factor of the driving thin film transistor; Vs represents an electric potential at the drain of the driving thin film transistor corresponding to the actual current-to-voltage conversion factor thereof; and Vs01 represents an electric potential at the drain of the driving thin film transistor corresponding to the preset target current-to-voltage conversion factor thereof.

12. The method according to claim 11, wherein the step of obtaining the actual luminous efficiency of the organic light emitting diode comprises sub steps of:
applying a scanning signal to the gate of the switching thin film transistor and applying a third data signal to the source thereof respectively, so that the gate of the driving thin film transistor reaches a third preset initial potential; and at the same time, applying a control signal to the gate of the controlling thin film transistor and applying an enable signal to the source thereof respectively, so that the drain of the driving thin film transistor reaches a preset initial potential, wherein the third preset initial potential is calculated based on the first preset initial potential, the actual threshold voltage, the preset target threshold voltage, and the preset initial potential of the driving thin film transistor;

stopping application of the scanning signal to the gate of the switching thin film transistor and application of the enable signal to the source of the controlling thin film transistor, wherein the first driving voltage enables a current flowing through the organic light emitting diode via the driving thin film transistor to be constant;

charging the organic light emitting diode until a voltage difference between two ends thereof is stabilized, and then collecting an electrical potential at drain of the driving thin film transistor; and calculating the actual luminous efficiency of the organic light emitting diode, according to preset target luminous efficiency of the organic light emitting diode and a corresponding electric potential value at the drain of the driving thin film transistor as well as the second driving voltage, and based on an inverse proportional relationship between the luminous efficiency of the organic light emitting diode and the voltage difference between the two ends of thereof.

13. The method according to claim 12, wherein the third preset initial potential is calculated according to a following formula:

$$V_g'' = \sqrt{\frac{k0}{k}}(Vdata - VCM) + VCM + \Delta V_{th}$$

wherein, $V_g''$ represents the third preset initial potential, and $\Delta V_{th}$ represents a difference between the preset target threshold voltage and the actual threshold voltage of the driving thin film transistor.

14. The method according to claim 13, wherein the actual luminous efficiency of the organic light emitting diode is calculated according to a following formula:

$$\eta 0/\eta = (Vs - OVSS)/(Vs02 - OVSS)$$

wherein, $\eta 0$ represents the preset target luminous efficiency of the organic light emitting diode; $\eta$ represents the actual luminous efficiency of the organic light emitting diode; Vs02 represents an electric potential at the drain of the driving thin film transistor corresponding to the preset target luminous efficiency of the organic light emitting diode; OVSS represents the second driving voltage; and Vs represents an electric potential at the drain of the driving thin film transistor corresponding to the actual luminous efficiency of the organic light emitting diode.

15. The method according to claim 14, wherein the step of calculating a compensation data signal inputted to the source of the switching thin film transistor, based on the obtained actual threshold voltage and actual current-to-voltage conversion factor of the driving thin film transistor and actual luminous efficiency of the organic light emitting diode comprises sub steps of:

compensating the actual current-to-voltage conversion factor of the driving thin film transistor and the actual luminous efficiency of the organic light emitting diode according to a following formula:

$$V_g' = \sqrt{\frac{k0*\eta 0}{k*\eta}}(Vg - Vs) + Vs,$$

wherein, $V_g'$ represents an electric potential of the gate of the driving thin film transistor after the actual current-to-voltage conversion factor of the driving thin film transistor and the actual luminous efficiency of the organic light emitting diode are compensated;

compensating the actual threshold voltage of the driving thin film transistor according to a following formula:

$$V_g'' = V_g' + \Delta V_{th},$$

wherein, $V_g''$ represents an electric potential of the gate of the driving thin film transistor after the actual threshold voltage thereof is compensated, and $\Delta V_{th}$ represents a difference between the preset target threshold voltage of the driving thin film transistor and the actual threshold voltage thereof; and determining a compensation data signal inputted to the source of the switching thin film transistor, according to the electric potential of the gate of the driving thin film transistor after the actual threshold voltage thereof is compensated.

16. The method according to claim 2, wherein the step of obtaining the actual current-to-voltage conversion factor of the driving thin film transistor comprises sub steps of:

applying a scanning signal to the gate of the switching thin film transistor and applying a second data signal to the source thereof respectively, so that the gate of the driving thin film transistor reaches a second preset initial potential; and at the same time, applying a control signal to the gate of the controlling thin film transistor and applying an enable signal to the source thereof respectively, so that the drain of the driving thin film transistor reaches a preset initial potential, wherein the second preset initial potential equals to a sum of the first preset initial potential and the actual threshold voltage of the driving thin film transistor;

stopping application of the scanning signal to the gate of the switching thin film transistor and application of the enable signal to the source of the controlling thin film transistor, and charging the drain of the driving thin film transistor by the first driving voltage;

collecting an electric potential value at the drain of the driving thin film transistor after the drain of the driving thin film transistor is charged for a predetermined time period; and calculating the actual current-to-voltage conversion factor of the driving thin film transistor, according to a preset target current-to-voltage conversion factor of the driving thin film transistor and a corresponding electric potential at the drain thereof, as well as the obtained electric potential value at the drain of the driving thin film transistor and the preset initial potential.

17. The method according to claim 16, wherein the actual current-to-voltage conversion factor of the driving thin film transistor is calculated according to a following formula:

$$k0/k = (Vs01 - VCM)/(Vs - VCM),$$

wherein, k0 represents the preset target current-to-voltage conversion factor of the driving thin film transistor; k represents the actual current-to-voltage conversion factor of the driving thin film transistor; Vs represents an electric potential at the drain of the driving thin film transistor corresponding to the actual current-to-voltage conversion factor thereof; and Vs01 represents an electric potential at the drain of the driving thin film transistor corresponding to the preset target current-to-voltage conversion factor thereof.

18. The method according to claim 17, wherein the step of obtaining the actual luminous efficiency of the organic light emitting diode comprises sub steps of:
- applying a scanning signal to the gate of the switching thin film transistor and applying a third data signal to the source thereof respectively, so that the gate of the driving thin film transistor reaches a third preset initial potential; and at the same time, applying a control signal to the gate of the controlling thin film transistor and applying an enable signal to the source thereof respectively, so that the drain of the driving thin film transistor reaches a preset initial potential, wherein the third preset initial potential is calculated based on the first preset initial potential, the actual threshold voltage, the preset target threshold voltage, and the preset initial potential of the driving thin film transistor;
- stopping application of the scanning signal to the gate of the switching thin film transistor and application of the enable signal to the source of the controlling thin film transistor, wherein the first driving voltage enables a current flowing through the organic light emitting diode via the driving thin film transistor to be constant;
- charging the organic light emitting diode until a voltage difference between two ends thereof is stabilized, and then collecting an electric potential value at the drain of the driving thin film transistor; and
- calculating the actual luminous efficiency of the organic light emitting diode, according to preset target luminous efficiency of the organic light emitting diode and a corresponding electric potential value at the drain of the driving thin film transistor as well as the second driving voltage, and based on an inverse proportional relationship between the luminous efficiency of the organic light emitting diode and the voltage difference between the two ends thereof.

19. The method according to claim 18, wherein the third preset initial potential is calculated according to a following formula:

$$V_g'' = \sqrt{\frac{k0}{k}}(Vdata - VCM) + VCM + \Delta V_{th},$$

wherein, $V_g''$ represents the third preset initial potential, and $\Delta V_{th}$ represents a difference between the preset target threshold voltage and the actual threshold voltage of the driving thin film transistor.

20. The method according to claim 19, wherein the actual luminous efficiency of the organic light emitting diode is calculated according to a following formula:

$$\eta 0/\eta = (Vs - OVSS)/(Vs02 - OVSS),$$

wherein, $\eta 0$ represents the preset target luminous efficiency of the organic light emitting diode; $\eta$ represents the actual luminous efficiency of the organic light emitting diode; $Vs02$ represents an electric potential at the drain of the driving thin film transistor corresponding to the preset target luminous efficiency of the organic light emitting diode; OVSS represents the second driving voltage; and Vs represents an electric potential at the drain of the driving thin film transistor corresponding to the actual luminous efficiency of the organic light emitting diode.

* * * * *